(12) United States Patent
Vigna et al.

(10) Patent No.: US 6,358,769 B1
(45) Date of Patent: Mar. 19, 2002

(54) PROCESS FOR MANUFACTURING MECHANICAL, ELECTROMECHANICAL AND OPTO-ELECTROMECHANICAL MICROSTRUCTURES HAVING SUSPENDED REGIONS SUBJECT TO MECHANICAL STRESSES DURING ASSEMBLY

(75) Inventors: Benedetto Vigna, Pietrapertosa; Ubaldo Mastromatteo, Bareggio, both of (IT)

(73) Assignee: STMicroelectronics S.r.l., Agrate Brizana (IT)

( * ) Notice: Subject to any disclaimer, the term of this patent is extended or adjusted under 35 U.S.C. 154(b) by 0 days.

(21) Appl. No.: 09/513,476

(22) Filed: Feb. 25, 2000

(30) Foreign Application Priority Data

Feb. 26, 1999 (EP) .............................................. 99830107

(51) Int. Cl.[7] .......................... H01L 21/00; G01L 1/04; G01L 1/22
(52) U.S. Cl. .................. 438/52; 438/53; 73/862.632; 73/862.639
(58) Field of Search .............................. 438/50, 51, 52, 438/53; 156/644; 73/862.636, 862.634, 862.639

(56) References Cited

U.S. PATENT DOCUMENTS

| | | | |
|---|---|---|---|
| 5,060,039 A | | 10/1991 | Weinberg et al. ............. 357/26 |
| 5,258,097 A | * | 11/1993 | Mastrangelo ................ 156/644 |
| 5,332,469 A | * | 7/1994 | Mastrangelo ................ 156/643 |
| 5,415,726 A | | 5/1995 | Staller et al. .................... 216/2 |
| 5,525,422 A | * | 6/1996 | Spies et al. ................... 428/355 |
| 5,539,550 A | * | 7/1996 | Spitzer et al. ................. 359/59 |
| 5,637,904 A | | 6/1997 | Zettler ........................... 257/417 |
| 5,750,420 A | * | 5/1998 | Bono et al. ..................... 438/52 |
| 5,998,816 A | * | 12/1999 | Nakaki et al. ............... 257/254 |
| 6,184,052 B1 | * | 2/2001 | Vigna et al. .................... 438/51 |

OTHER PUBLICATIONS

Yun, "Surface Micromachined, Digitally Force–Balanced Accelerometer with Integrated CMOS Detection Circuitry," *IEEE Solid–State Sensor and Actuator Workshop*, Hilton Head Island, South Carolina, Jun. 22–25, 1992, pp. 126–131.

\* cited by examiner

*Primary Examiner*—John F. Niebling
*Assistant Examiner*—Viktor Simkovic
(74) *Attorney, Agent, or Firm*—Lisa Jorgenson; Robert Iannucci; Seed IP Law Group, PLLC

(57) ABSTRACT

To reduce the risk of breakage of the moving parts of an integrated microstructure during manufacture steps causing mechanical stresses to the moving parts, a temporary immobilization and support structure is formed, whereby a moving region of the microstructure is temporarily integral with the fixed region. The temporary structure is removed at the end of the assembly operations by non-mechanical removal methods. According to one solution, the temporary structure is formed by a fusible element removed by melting or evaporation, by applying a sufficient quantity of energy thereto. Alternatively, a structural region of polymer material is formed in the trench separating the moving part from the fixed part, or an adhesive material layer sensitive to ultraviolet radiation is applied.

37 Claims, 3 Drawing Sheets

PROCESS FOR MANUFACTURING MECHANICAL, ELECTROMECHANICAL AND OPTO-ELECTROMECHANICAL MICROSTRUCTURES HAVING SUSPENDED REGIONS SUBJECT TO MECHANICAL STRESSES DURING ASSEMBLY

TECHNICAL FIELD

The invention relates to a process for manufacturing mechanical, electromechanical and opto-electromechanical mirostructures having suspended regions subject to mechanical stresses during assembly.

BACKGROUND OF THE INVENTION

As known, during the manufacture of microstructures of mechanical, electromechanical and opto-electromechanical type, suspended regions are formed which may be damaged by mechanical stresses induced by the final assembly processes. For example, during the manufacture of integrated hard disk drive units, comprising a microactuator to which a read/write head is glued, the steps of attaching the head to the microactuator and gluing, and causing pressure on the rotor of the microactuator, may cause the breakage of the suspension points of the rotor and the collapse thereof. Similar problems arise in opto-microelectromechanical devices where it is necessary, for example, to move an optical fiber with a micromotor. The forces required for this assembly operation, of the order of tens of grams force, may irreparably damage the moving parts of the microstructures.

SUMMARY OF THE INVENTION

An embodiment of the present invention provides solutions to reduce the risk of breakage of the suspensions of the moving parts of microstructures of the mentioned type.

The invention provides a process for manufacturing microstructures, as defined in the claims.

BRIEF DESCRIPTION OF THE DRAWINGS

For an understanding of the invention, three embodiments will now be described, purely by way of non-exhaustive and non-limiting examples, with reference to the accompanying drawings wherein.

In the figures, like reference numerals refer to like parts throughout the various views unless otherwise indicated.

DETAILED DESCRIPTION OF THE ILLUSTRATED EMBODIMENTS

Figure 1:
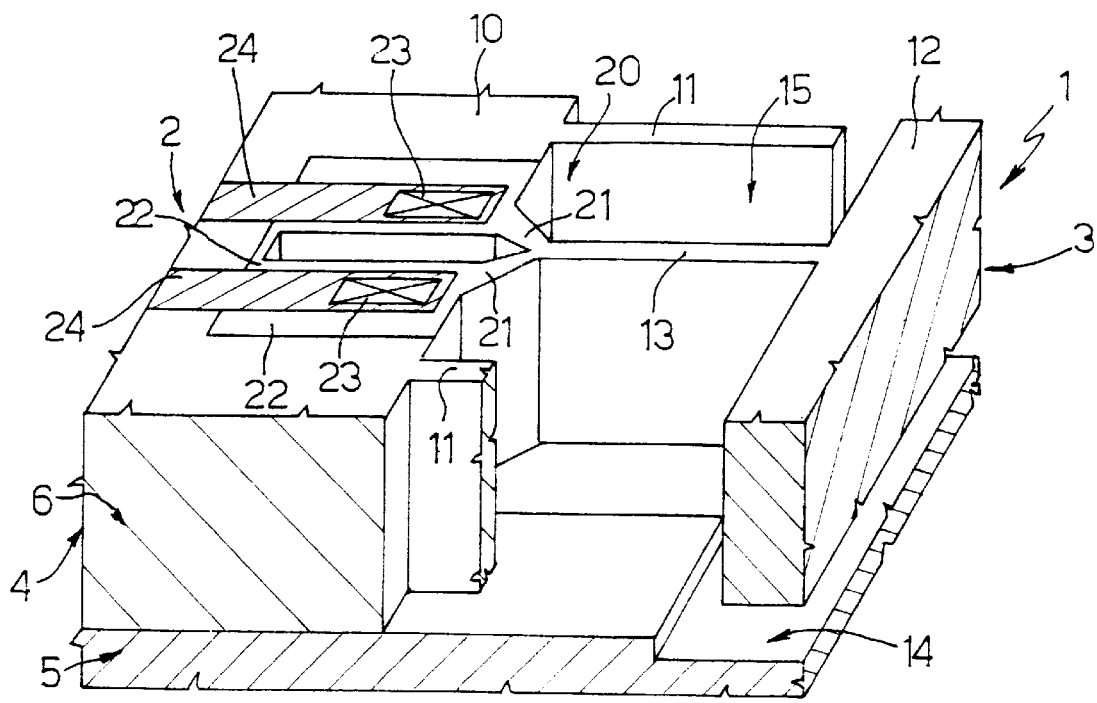
FIG. 1 is a perspective view, partially interrupted, of a micromechanical structure during a step of a first embodiment of the manufacturing process.

FIG. 1 shows a portion of a microactuator 1 comprising a stator 2 and a rotor 3 used, for example, in a hard disk read/write assembly with micrometric actuation. The microactuator 1 is formed in a semiconductor material wafer 4 comprising a substrate 5 and an epitaxial layer 6 inside which electronic components (not shown), the stator 2, and the rotor 3 are formed.

The stator 2 is carried by the substrate 5 and comprises a fixed region 10 connected to a plurality of fixed arms 11, which are also carried by the substrate 5. The rotor 3 is separated from the stator 2 by a trench 15. The rotor 3 is held by suspension arms (not shown) and comprises a suspended mass 12 and a plurality of moving arms 13, only one of which is shown in FIG. 1. An air gap 14 separates the rotor 3 from the substrate 5 and extends underneath the rotor 3.

To prevent the rotor 3 from collapsing on the substrate 5 during the operations of attaching the head (not shown) and bonding, fusible elements are provided according to a first embodiment of the invention, anchoring the suspended regions to the fixed regions. In particular, FIG. 1 shows a fusible element 20 anchoring the moving arm 13 to the fixed region 10. The fusible element 20 is formed by a pair of walls 21 extending from two adjacent zones of the fixed region 10 as far as the end of the fixed arm 13, forming a wedge-shaped structure. The thickness of the walls 21 is chosen so as to permit the walls 21 to melt or evaporate when a predetermined quantity of energy is applied (electrically, with a laser beam, or by other methods). In one embodiment, this thickness is less than 5 $\mu$m.

In the illustrated embodiment, wherein melting takes place by electrical means, a highly doped conductive region 22 is formed inside the fixed region 10 and is suitably isolated from the rest of the fixed region 10 (in a manner not shown) by junction isolation or a suitable trench, for example. The walls 21 extend from the conductive region 22 and are electrically connected thereto. Contact regions 23 (shown diagrammatically in FIG. 1) electrically connect the conductive region 22 to metal tracks 24 and to a current source (not shown).

Figure 2:
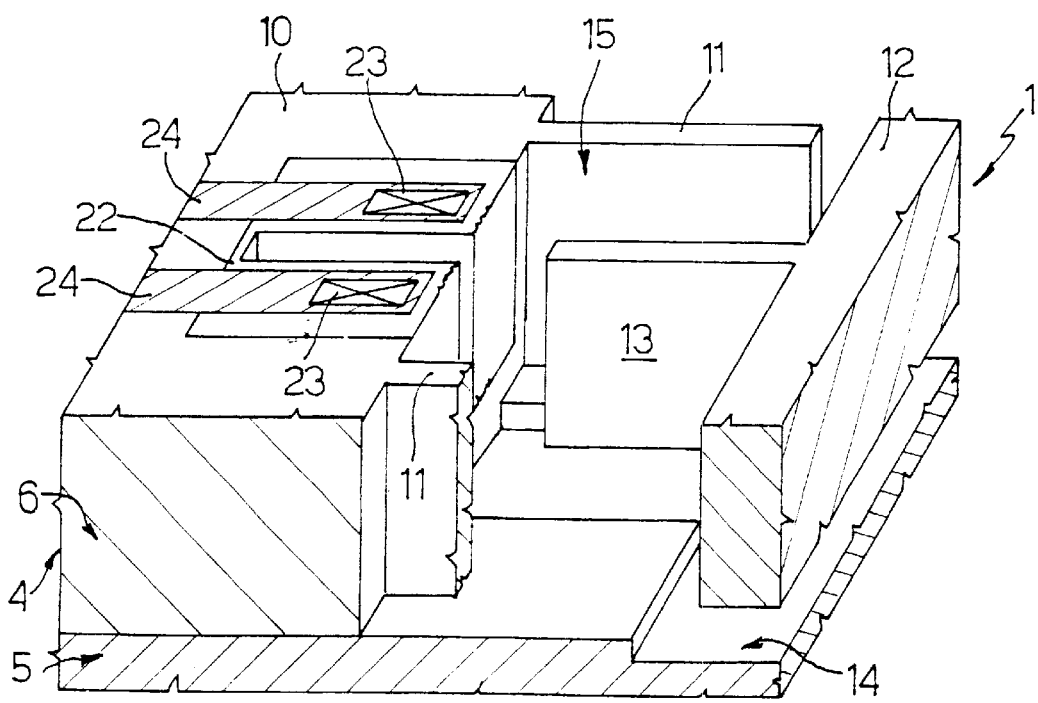
FIG. 2 shows a view similar to that of FIG. 1, in a subsequent step.

The fusible element 20 is formed when excavating the trench 15 that separates the stator 2 from the rotor 3. To this end, during the steps for forming the components integrated inside the wafer 4, the conductive region 22, and the portion of the epitaxial layer 6 wherein the fusible elements 20 are to be formed are suitably doped. The mask for defining the trench 15 is suitably shaped so as to form a plurality of fusible elements 20 to ensure sufficient resistance of the rotor 3 to mechanical stresses during the subsequent manufacturing steps, particularly when attaching the read/write head (not shown) to the rotor 3 and bonding the electrical connections. The fusible element 20 is removed when the operations which may cause a stress to the rotor 3 are completed. In particular, a high current is fed through the metal tracks 24 and the conductive region 22 to the walls 21 so as to cause them to melt, as shown in FIG. 2. For example, a current equal to 200–300 mA is applied.

Figure 3:
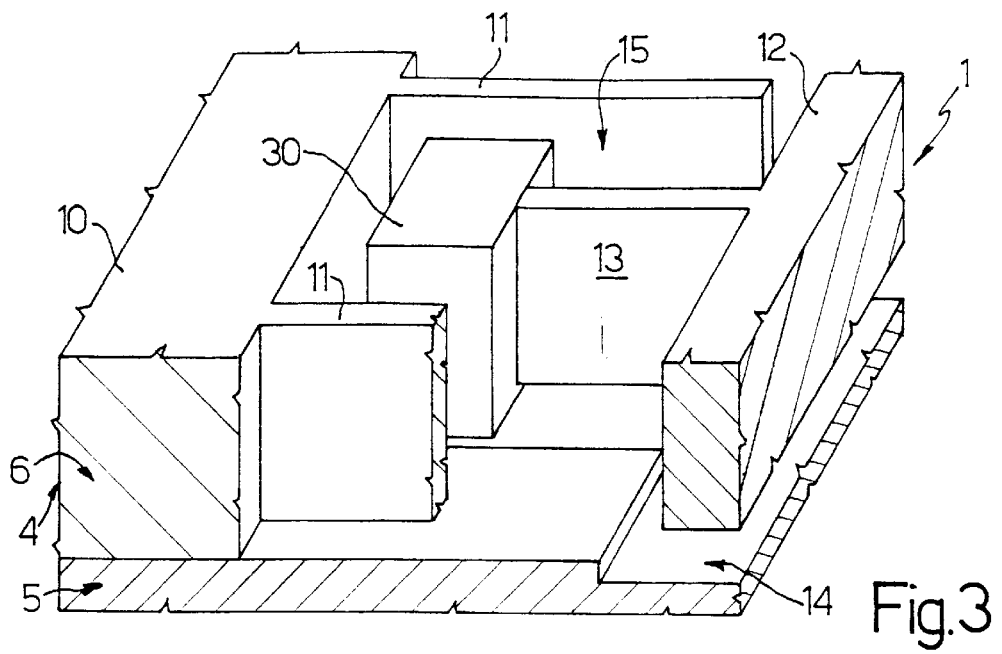
FIG. 3 is a perspective view, partially interrupted, of a micromechanical structure during a step of a second embodiment of the process.

FIG. 3 shows another embodiment of the invention in which the suspended structures are temporarily locked by structural immobilization elements of a material resistant to chemical agents used to free the moving structure and such as to connect it to the substrate 5 or other fixed parts. As shown in FIG. 3, wherein the parts in common with the embodiment of FIG. 1 have been denoted by the same reference numerals and so are not described again, an immobilization region 30 is formed inside the trench 15, in a position adjacent to and in contact with the moving arm 13 of the rotor 3. The immobilization region 30 is supported on the substrate 5 and can be made of photoresist or another polymer which can be removed in gaseous phase.

Figure 4:
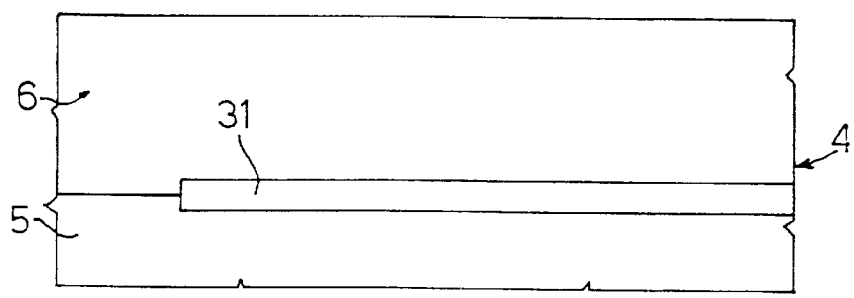
FIGS. 4–8 show cross-sections through a wafer of semiconductor material in successive steps of the manufacturing process according to FIG. 3.

The immobilization region 30 is formed in the manner described with reference to FIGS. 4–8. FIG. 4 shows an initial structure comprising the substrate 5, the epitaxial layer 6, and a sacrificial region 31 arranged between the substrate 5 and the epitaxial layer 6. The sacrificial region 31 is made, for example, of silicon oxide grown selectively before forming the epitaxial layer 6, in per se known manner. In particular the sacrificial region 31 is present in the zone where the rotor 3 and the trench 15 are to be formed.

Figure 5:
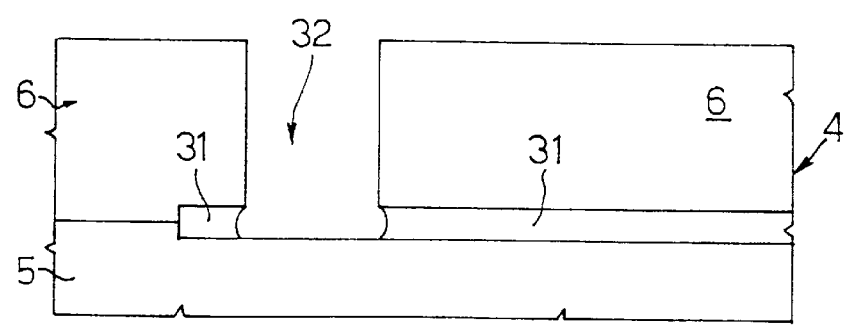
Figure 6:
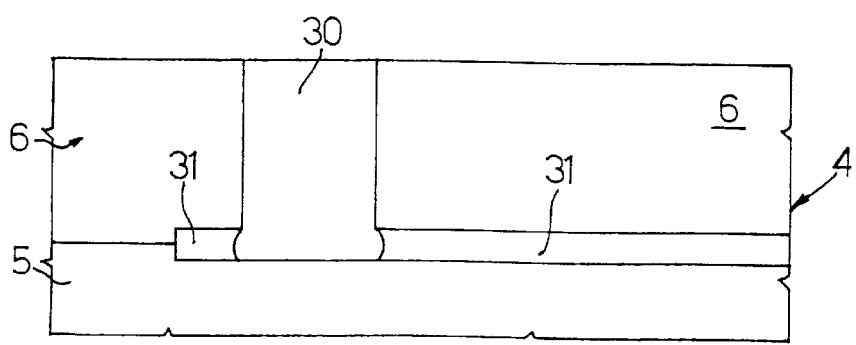

After the possible manufacture of electronic components (not shown) and immediately before the trench 15 is formed, the wafer 4 is masked and chemically etched to selectively remove portions of the epitaxial layer 6 and the sacrificial region 31 in the zones where the immobilization regions 30 are to be formed, thereby forming openings 32. In particular, FIG. 5 shows an opening 32 extending completely through the epitaxial layer 6 and the sacrificial region 31 as far as the substrate 5. A layer of structural material (e.g., photoresist or polymer) which fills the openings 32 is then deposited. The part of the layer of structural material which projects from the openings 32 is then removed, by chemical-mechanical action, such as Chemical-Mechanical Polishing (CMP). The immobilization regions 30 are thus formed inside the openings 32, as shown in FIG. 6.

Figure 7:
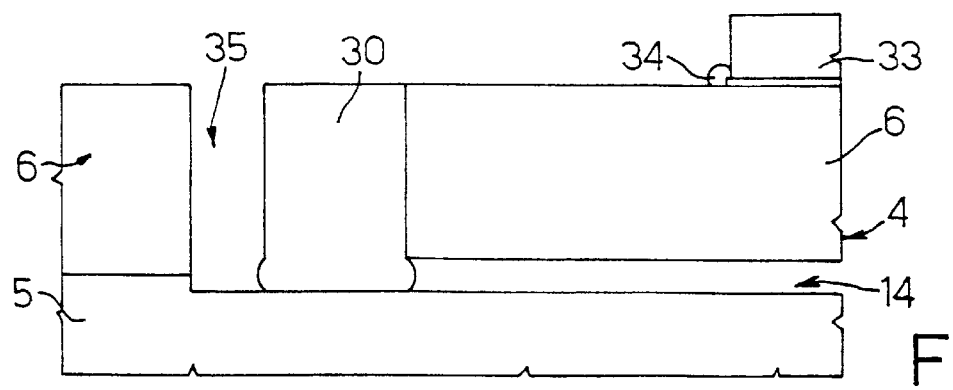

A trench 35 for defining the microactuator 1 is then formed. Through the trench 35, the remaining portions of the sacrificial region 31 are also removed, forming the air gap 14, as shown in FIG. 7.

Figure 8:
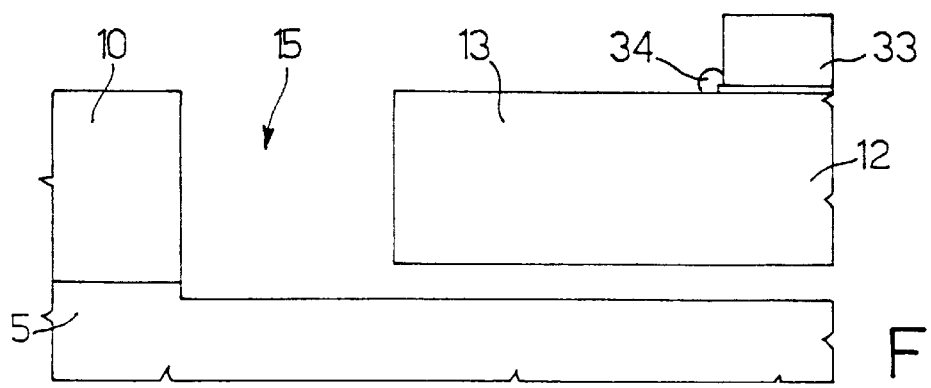

Assembly steps are then carried out. According to FIG. 7, for example, a read/write head 33 is glued to the suspended mass 12 and the electrical connections are bonded (as shown diagrammatically by the ball-shaped connections 34). During this step, the rotor 3 is immobilized and held by the immobilization structures 30 which absorb any stresses, preventing the suspension arms (not shown) from breaking. Finally, the immobilization structures 30 are removed (e.g., by plasma etching), as shown in FIG. 8, and the trench 35, together with the openings 32, form the final trench 15.

Figure 9:
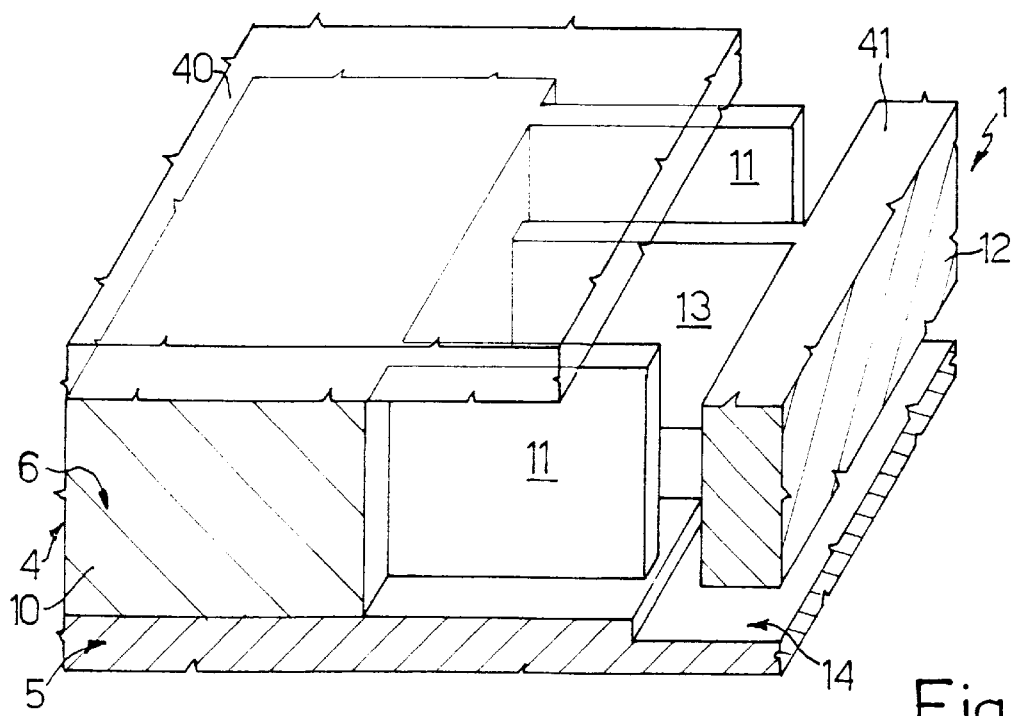
FIG. 9 shows a perspective view, partially interrupted, of a micromechanical structure during a step of a third embodiment of the process.

FIG. 9 shows a further embodiment of the invention according to which external structural elements, removable after assembly, are applied to the surface of the wafer 4 at the areas where the moving and fixed parts join. Specifically in FIG. 9, an adhesive material layer 40, such as "stick foil" sensitive to ultraviolet rays, extends on top of the surface 41 of the wafer 4. In particular, the adhesive material layer 40 adheres to part of the fixed region 10, to the fixed arms 11, and to the end of the moving arms 13. The adhesive material layer 40, which is transparent, is deposited on the entire surface of the wafer 4 and is then selectively dry removed, for example from the zone of the rotor 3 on which the read/write head 33 is to be glued, by photolithographic methods. The adhesive material layer 40 thus holds the rotor 3 during assembly and is removed at the end of the stress by dry etching in $O_2$-based plasma.

By virtue of embodiments of the present process, moving parts of an integrated microstructure are rendered integral with the fixed parts during the manufacturing steps when they are subject to mechanical stress, and thus ensure the integrity thereof. The described solutions are completely compatible with manufacturing processes normally used in microelectronics. Therefore they do not cause application problems and do not damage any electronic devices formed inside the wafer. Embodiments such as the described processes ensure high efficiency in the assembly operations, are simple to apply, and are of low cost.

Finally, it is evident that numerous modifications and variations may be introduced to the process described and illustrated herein, all of which come within the scope of the invention, as defined in the accompanying claims. For instance, it should be noted that the present process is applicable to all microstructures regardless of their material (silicon, metallic material, such as nickel, etc.), even if it is advantageously applied in case of microstructures formed in the epitaxial layer (generally in a multicrystal portion thereof, as described in EP-A-0 822 579, for example).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing microstructures having at least one fixed region and a moving region, the process comprising:
    in an epitaxial layer overlaying a substrate, forming a fixed region and a moving region;
    in said epitaxial layer, forming a temporary immobilization and support structure that renders said moving region temporarily integral with said fixed region;
    applying mechanical stress; and
    removing non-mechanically said temporary immobilization and support structure.

2. A process according to claim 1, further comprising:
    forming a semiconductor material wafer comprising said substrate, said epitaxial layer overlaying said substrate, and sacrificial regions extending between said substrate and said epitaxial layer; and
    forming a trench in said epitaxial layer, said trench separating said moving region from said fixed region.

3. A process according to claim 1 wherein forming the temporary immobilization and support structure comprises forming a fusible element mechanically connecting said fixed region and said moving region and wherein removing said temporary immobilization and support structure comprises supplying said fusible element with a quantity of energy sufficient for said fusible element to melt or evaporate.

4. A process according to claim 3 wherein supplying said fusible element with the quantity of energy comprises feeding a current.

5. The process according to claim 3 wherein supplying said fusible element with the quantity of energy comprises supplying laser light.

6. The process according to claim 1 wherein forming the temporary immobilization and support structure comprises forming at least one connection wall connecting a portion of said fixed region to a portion of said moving region.

7. The process according to claim 6 wherein said connection wall has a thickness less than substantially 5 $\mu$m.

8. The process according to claim 2 wherein forming the temporary immobilization and support structure comprises forming a structural region in said trench in a position adjacent to and in contact with said moving region.

9. The process according to claim 8 wherein said structural region bears on said substrate.

10. A process for manufacturing microstructures having at least one fixed region and a moving region, the process comprising:
    forming a semiconductor material wafer comprising a substrate, an epitaxial layer overlaying said substrate and sacrificial regions extending between said substrate and said epitaxial layer; and forming a trench in said epitaxial layer, said trench separating said moving region from said fixed region;

forming a structural region in said trench in a position adjacent to and in contact with said moving region by:

carrying out a first excavation in said epitaxial layer through its entire thickness and forming at least one opening, filling said at least one opening with structural material, and carrying out a second excavation adjacent to said first excavation to form said trench, thereby forming a temporary immobilization and support structure that renders said moving region temporarily integral with said fixed region;

applying mechanical stress; and removing non-mechanically said temporary immobilization and support structure.

11. The process according to claim 10 wherein said structural material comprises a polymer.

12. The process according to claim 10 wherein carrying out the second excavation comprises plasma removing said structural material.

13. The process according to claim 1 wherein forming the temporary immobilization and support structure comprises applying an adhesive material layer to a surface of said microstructure.

14. The process according to claim 13, further comprising selectively removing portions of said adhesive material layer through photolithographic methods.

15. The process according to claim 13 wherein said adhesive material layer is formed by an adhesive stick foil sensitive to ultraviolet radiation.

16. A method of manufacturing a microstructure, the method comprising:

forming first and second regions;

forming a temporary immobilization structure integral with the first and second regions;

attaching a component to the second region; and detaching the second region from the first region to make the second region a movable region by removing the temporary immobilization structure.

17. The method of claim 16 wherein removing the temporary immobilization structure comprises applying energy to the temporary immobilization structure sufficient to melt or evaporate the temporary immobilization structure.

18. The method of claim 16 wherein forming the temporary immobilization structure comprises forming a connection wall connecting a portion of the first region to a portion of the second region.

19. The method of claim 16, further comprising forming a trench separating the first region from the second region.

20. The method of claim 16 wherein the first region comprises a fixed region.

21. The process according to claim 1 wherein said forming a fixed region and a moving region in said epitaxial layer and said forming a temporary immobilization and support structure in said epitaxial layer are a single forming operation.

22. The process according to claim 1 wherein said temporary immobilization and support structure laterally supports said moving region.

23. The process according to claim 1 wherein forming the temporary immobilization and support structure comprises:

forming a fusible element mechanically connecting the fixed region and the moving region; and doping the fusible element; and wherein removing the temporary immobilization and support structure comprises supplying the fusible element with a quantity of energy sufficient to melt or evaporate the fusible element.

24. The process according to claim 23 wherein supplying the fusible element with the quantity of energy comprises feeding a current.

25. The process according to claim 16 wherein forming the temporary immobilization structure comprises applying an adhesive material layer to a surface of said microstructure.

26. A process for manufacturing microstructures, the process comprising:

forming an epitaxial layer overlaying a substrate;

forming in the epitaxial layer a fixed region and a moving region;

forming in the epitaxial layer a temporary immobilization and support structure between the moving region and the fixed region;

doping the temporary immobilization and support structure; and feeding a current of sufficient magnitude to the temporary immobilization and support structure to remove the temporary immobilization and support structure.

27. The process according to claim 26 wherein the doping of the temporary immobilization and support structure further comprises doping a portion of the epitaxial layer adjacent thereto, whereby the doped adjacent portion is rendered electrically conductive.

28. The process according to claim 27 wherein the feeding a current to the temporary immobilization and support structure further comprises feeding a current to the doped portion of the epitaxial layer adjacent to the temporary immobilization and support structure.

29. A process for manufacturing microstructures, the process comprising:

forming an epitaxial layer overlaying a substrate;

forming in the epitaxial layer a fixed region and a moving region;

forming in the epitaxial layer a trench laterally delimiting the fixed and moving regions;

forming in the trench a temporary immobilization and support structure between the moving region and the fixed region;

applying mechanical stress; and removing non-mechanically the temporary immobilization and support structure.

30. The process according to claim 29, further comprising:

forming a layer of sacrificial material between the substrate and at least the moving region and the trench of the epitaxial layer; and forming the trench as extending into and removing selected portions of the layer of sacrificial material; and wherein forming in the trench a temporary immobilization and support structure between the moving region and the fixed region includes:

depositing a structural material in the trench, and forming a second trench between the structural material and the fixed region.

31. The process according to claim 30, further comprising chemically removing the layer of sacrificial material.

32. The process according to claim 31 wherein the layer of sacrificial material comprises silicon oxide.

33. The process according to claim 31 wherein the structural material is one of a photoresist and a polymer.

34. A process for manufacturing microstructures, the process comprising:

forming an epitaxial layer overlaying a substrate;

forming in the epitaxial layer a fixed region and a moving region mechanically separated from the fixed region;

applying a removable external structural element to portions of a surface of the epitaxial layer adjacent to a region of mechanical separation between the fixed and moving regions, whereby a temporary immobilization and support structure is formed between the fixed and moving regions;

applying mechanical stress; and removing the removable external structural element.

35. The process according to claim 34 wherein the removable external structural element comprises an adhesive material layer.

36. The process according to claim 35, further comprising selectively removing portions of the adhesive material layer using photolithographic methods.

37. The process according to claim 35 wherein the adhesive material layer is formed by an adhesive stick foil that is sensitive to ultraviolet radiation.

\* \* \* \* \*

UNITED STATES PATENT AND TRADEMARK OFFICE
CERTIFICATE OF CORRECTION

PATENT NO.  : 6,358,769 B1
DATED       : March 19, 2002
INVENTOR(S) : Benedetto Vigna et al.

It is certified that error appears in the above-identified patent and that said Letters Patent is hereby corrected as shown below:

<u>Title page,</u>
Item [73], the assingee's address should read -- Agrate Brianza, (IT) --.

Signed and Sealed this

Twenty-fourth Day of September, 2002

*Attest:*

JAMES E. ROGAN
*Attesting Officer*  *Director of the United States Patent and Trademark Office*